(12) United States Patent
Jeong

(10) Patent No.: US 10,176,884 B2
(45) Date of Patent: Jan. 8, 2019

(54) SENSE AMPLIFIER DRIVING DEVICE

(71) Applicant: MagnaChip Semiconductor, Ltd., Cheongju-si (KR)

(72) Inventor: Duk Ju Jeong, Seoul (KR)

(73) Assignee: MagnaChip Semiconductor, Ltd., Cheongju-si (KR)

(*) Notice: Subject to any disclaimer, the term of this patent is extended or adjusted under 35 U.S.C. 154(b) by 0 days.

(21) Appl. No.: 15/787,491

(22) Filed: Oct. 18, 2017

(65) Prior Publication Data

US 2018/0144809 A1 May 24, 2018

(30) Foreign Application Priority Data

Nov. 21, 2016 (KR) .......................... 10-2016-0155218

(51) Int. Cl.
G11C 11/00 (2006.01)
G11C 7/00 (2006.01)
G11C 17/18 (2006.01)
G11C 17/16 (2006.01)

(52) U.S. Cl.
CPC .............. *G11C 17/18* (2013.01); *G11C 17/16* (2013.01)

(58) Field of Classification Search
CPC ... G11C 7/12; G11C 11/4091; G11C 11/4094; G11C 7/06; G11C 2207/002; G11C 7/18
See application file for complete search history.

(56) References Cited

U.S. PATENT DOCUMENTS

| 6,480,037 B1 | 11/2002 | Song et al. | |
| 2007/0247942 A1* | 10/2007 | Park | G11C 7/02 365/208 |
| 2008/0198643 A1* | 8/2008 | Shin | G11C 17/18 365/96 |
| 2012/0170351 A1* | 7/2012 | Clinton | G11C 11/1673 365/145 |
| 2015/0155018 A1* | 6/2015 | Lee | G11C 7/222 365/194 |

FOREIGN PATENT DOCUMENTS

KR 20120131470 A 12/2012

* cited by examiner

*Primary Examiner* — Hien Nguyen
(74) *Attorney, Agent, or Firm* — Polsinelli LLP; Adam P. Daniels, Esq.

(57) ABSTRACT

A semiconductor memory device includes a memory cell, a bit line connected to the memory cell, and a sense amplifier. The sense amplifier is connected to the bit line, receives a first control signal, and detects and amplifies a bit line signal of the bit line. The sense amplifier includes a precharge device that is turned on or turned off based on a read control signal, and a transistor output unit that outputs an output voltage based on the bit line signal when the precharge device is turned off.

13 Claims, 4 Drawing Sheets

SENSE AMPLIFIER DRIVING DEVICE

CROSS REFERENCE TO PRIOR APPLICATIONS

This application claims priority under 35 U.S.C. § 119(a) to Korean Patent Application No. 10-2016-0155218 filed on Nov. 21, 2016 in the Korean Intellectual Property Office, the entire disclosure of which is incorporated by reference herein.

FIELD OF THE DISCLOSURE

The present disclosure is related generally to semiconductor devices and, more specifically, to a sense amplifier driving device.

BACKGROUND OF DISCLOSURE

Memory devices typically include a plurality of memory cells and a plurality of data lines. The data lines include a plurality of bit lines, local input/output lines, global input/output lines, and the like. Memory devices, such as one-time programmable (OTP) memory devices, include a sense amplifier to amplify signals for smoother data transmission. Due to the continued refinement of semiconductor manufacturing technologies and miniaturization of integrated circuits, an operation voltage (VDD) has continuously become lowered. This requires, in an OTP memory, the programmed cells to have a lower resistance in order for a sense amplifier to carry out a read operation. However, it is difficult to construct the memory cells to have a lower resistance, and it may soon become very difficult to reliably carry out sensing operations as the operation voltage continues to be lowered.

SUMMARY OF THE DISCLOSURE

According to one aspect of the present disclosure, a semiconductor memory device includes a memory cell, a bit line connected to the memory cell, and a sense amplifier. The sense amplifier is connected to the bit line, receives a first control signal, and detects and amplifies a bit line signal of the bit line. The sense amplifier includes a precharge device that is turned on or turned off based on a read control signal, and a transistor output unit that outputs an output voltage based on the bit line signal when the precharge device is turned off.

The semiconductor memory device may further include a voltage generator that generates a first operation voltage. The precharge device and the transistor output unit may be supplied with the first operation voltage. The transistor output unit may include a pull-up device and a pull-down device connected in series and coupled between the first operation voltage and a ground voltage. The transistor output unit may output the first operation voltage or the ground voltage to a second level shifter based on the bit line signal. The second level shifter may output the first supply voltage or the ground voltage based on an output voltage of the transistor output unit.

The semiconductor memory device may further include a first level shifter that coverts the read control signal to a read control voltage, wherein the read control voltage may be supplied to the precharge device. The first control signal and the read control voltage may be supplied to the precharge device. The read control voltage may be higher than the first control signal.

The semiconductor memory device may further include a voltage generator that receives a first supply voltage, generates a first operation voltage based on the first supply voltage and supplies the first operation voltage to the sense amplifier.

The memory cell may be a programmed cell, and the bit line voltage of the bit line connected to the programmed cell may be discharged to a ground level when the sense amplifier receives the first control signal.

The memory cell may be an unprogrammed cell, and the bit line voltage of the bit line connected to the unprogrammed cell may be charged to a first operation voltage when the sense amplifier receives the first control signal.

The sense amplifier and the level shifter may include a transistor that operates at the first operation voltage without being damaged.

The first operation voltage may be higher than the first supply voltage. The first operation voltage may be about 2 V, and the first supply voltage may be less than about 1.5 V.

Additional features, advantages, and embodiments of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate embodiments of the disclosure and together with the detailed description serve to explain the principles of the disclosure. No attempt is made to show structural details of the disclosure in more detail than may be necessary for a fundamental understanding of the disclosure and the various ways in which it may be practiced.

DETAILED DESCRIPTION

Figure 1:
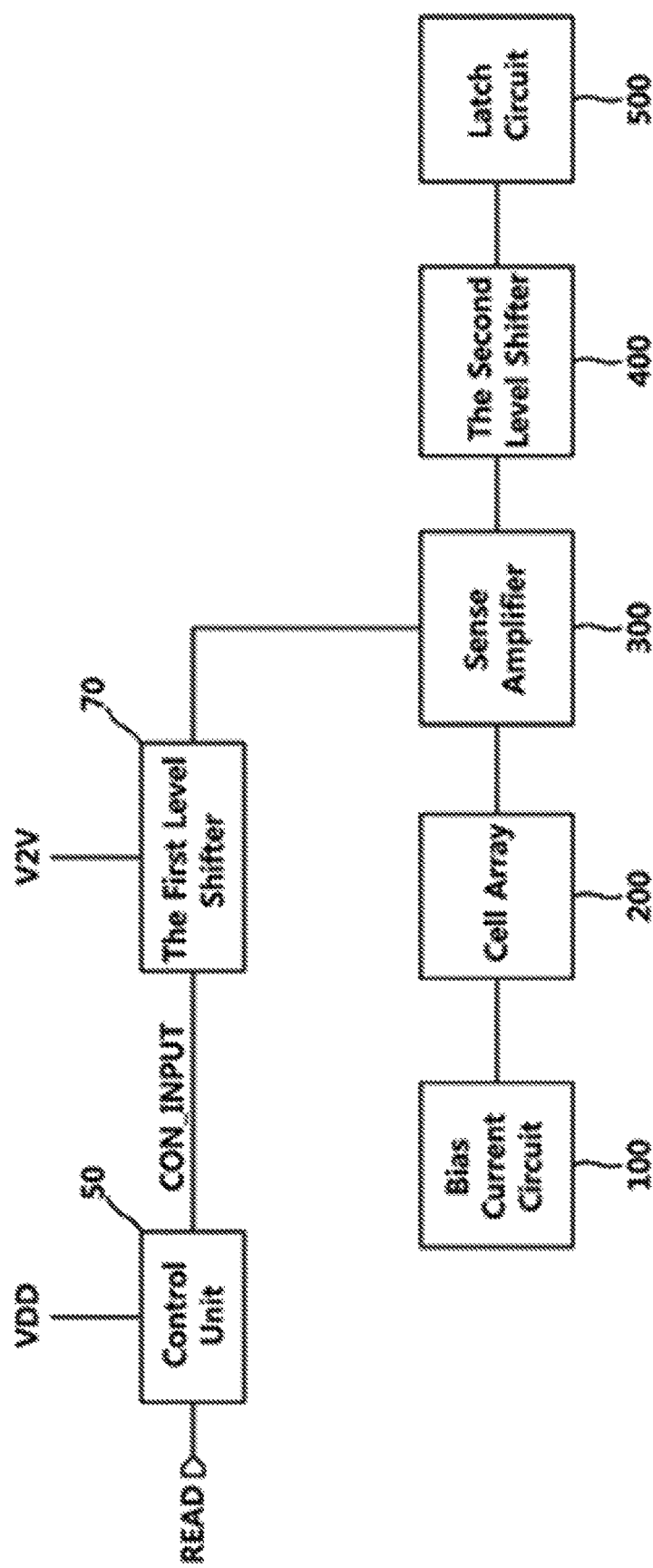
FIG. 1 schematically depicts an example of a sense amplifier driving device, constructed according to the principles of the disclosure.

The disclosure and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the disclosure. The examples used herein are intended merely to facilitate an understanding of ways in which the disclosure may be practiced and to further enable those of skill in the art to practice the embodiments of the disclosure. Accordingly, the examples and embodiments herein should not be construed as limiting the scope of the disclosure. Moreover, it is noted that like reference numerals represent similar parts throughout the several views of the drawings.

FIG. 1 schematically illustrates an example of a sense amplifier driving device, constructed according to the principles of the disclosure. The sense amplifier driving device may include a control unit 50, a first level shifter 70, a bias current circuit 100, a cell array 200, a sense amp 300, a second level shifter 400, and a latch circuit 500.

The control unit 50 may receive and convey a read control signal READ to the first level shifter 70. The read control signal READ may be converted to a read control voltage by the first level shifter 70, and the read control voltage may be supplied to a precharge device of the sense amplifier 300.

The first level shifter 70 may convert an input signal CON INPUT to a desired voltage level. An output of the first level shifter 70 may be connected to a gate terminal of a PMOS transistor MP2 (shown in FIG. 4) of the precharge device in the sense amplifier 300. The first level shifter 70 may supply the read control voltage to the sense amplifier 300. A first control signal PCG_ENB (shown in FIG. 4) and the read control voltage may be input to the gate terminal of the precharge device, and the read control voltage may be higher than the first control signal.

The bias current circuit 100 may generate and supply a bias current to the cell array 200. The bias current circuit 100 may generate and supply a current of about tens of nanoamperes to the cell array 200.

The cell array 200 may have a plurality of cells that are arranged in a matrix and connected to a plurality of word lines and a plurality of bit lines. Each cell may be constructed with a switching device and a capacitor. The switching device may be connected between a corresponding bit line and the capacitor, and selectively carries out a switching operation according to a signal applied thereto via a corresponding word line.

In a programming operation of a cell, a bit line voltage of the bit line connected to the cell by the first control signal PCG_ENB may be discharged to a ground level. When the cell is not being programmed, the bit line voltage of the bit line connected to the cell by the first control signal PCG_ENB may be charged to a first operation voltage.

The sense amplifier 300 may be provided with the first control signal PCG_ENB. The sense amplifier 300 may include the precharge device and an transistor output unit. The precharge device may include a transistor MP2, which may be turned on or off according to the read control signal READ. The transistor output unit may include transistors MP3, MN3 (shown in FIG. 4), which may output an output voltage according to the bit line signal when the precharge device is turned off, which is further described below in detail.

When a sensing operation is carried out by the sense amplifier 300, the second level shifter 400 may no longer need to operate transistors at an operation voltage of about 2.0 V, and the transistors connected to the sense amplifier 300 may use an operation voltage of less than about 2.0 V.

The sense amplifier 300 and the second level shifter 400 may be constructed with a plurality of transistors that may operate at a first operation voltage of about 2.0 V.

To be able to use a first supply voltage VDD (e.g., less than about 1.5 V) in the following stage, the sense amplifier 300 may need the second level shifter 400 for converting the first operation voltage of about 2.0 V to the first supply voltage VDD. According to the principles of the disclosure, two transistors that are smaller than a conventional level shifter may be used, which may reduce the layout area.

Figure 4:
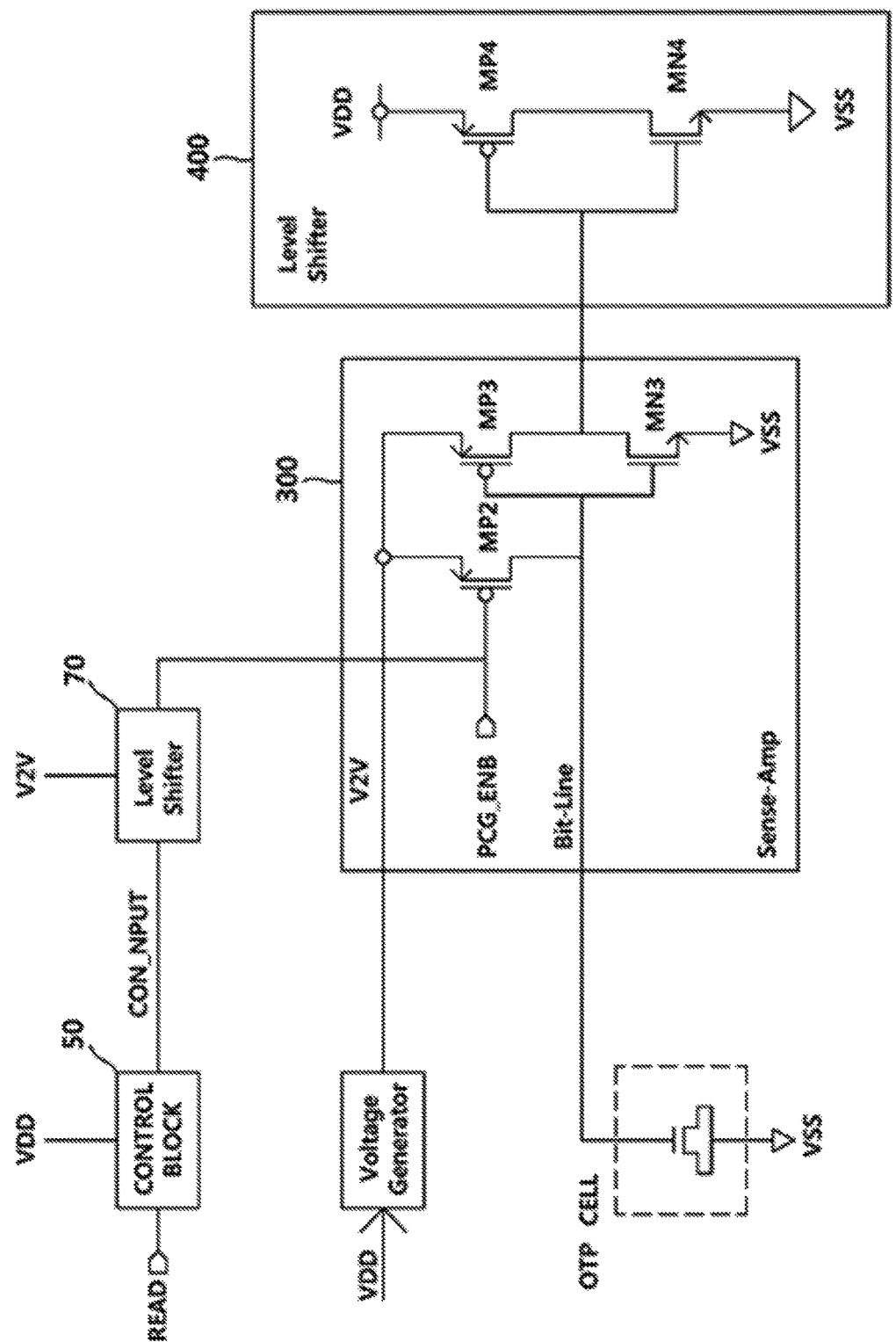
FIG. 4 schematically depicts an example of a sense amplifier, constructed according to the principles of the disclosure.

Referring to FIG. 4, the sense amplifier 300 may be connected the cell array via the bit line, and may detect and amplify by a signal on the bit line. The sense amplifier 300 may include a precharge device and a transistor output unit. The precharge device may include a transistor MP2 of a first conductivity type, and the transistor output unit may include a transistor MP3 of the first conductivity type and a transistor MN3 of a second conductivity type.

For example, the transistor MP3 may be a P-type transistor. A drain terminal of the transistor MP3 may be connected to a drain terminal of the transistor MN3, a source terminal of the transistor MP3 may be connected to receive the operation voltage, and a gate terminal of the transistor MP3 may be connected to the bit line. The transistor MN3 may be an N-type transistor. A drain terminal of the transistor MN3 may be connected to the drain terminal of the transistor MP3, a source terminal of the transistor MN3 may be grounded, and a gate terminal of the transistor MN3 may be connected to the bit line. The transistor MP2 may be a P-type transistor. A drain terminal of the transistor MP2 may be connected to the bit line, a source terminal of the transistor MP2 may be connected to the operation voltage, and a gate terminal of the transistor MP2 may be connected to the first level shifter 70 and the first control signal PCG_ENB. The transistors MP2, MP3 and MN3 may be medium voltage transistors, and the operation voltage supplied to the sense amplifier 300 may be about 2 V.

Still referring to FIG. 4, the second level shifter 400 may include a transistor MP4 of the first conductivity type (e.g., P-type) and a transistor MN4 of the second conductivity type (e.g., N-type). A drain terminal of the transistor MN4 may be connected to a drain terminal of the transistor MP4, and a source terminal of the transistor MN4 may be connected to the ground. Also, gates terminals of the transistors MP5, MN4 may be connected to an output terminal of the sense amplifier 300.

Referring back to FIG. 1, the latch circuit 500 may include a circuit which holds a data value for a predetermined period among semiconductor circuits. When data having a low value is input thereto, the latch circuit 500 may hold and output data having a low value until new data is input thereto. If the input data has a high value, the latch circuit 500 may maintain and output data having a high value until new data is input thereto.

Figure 2:
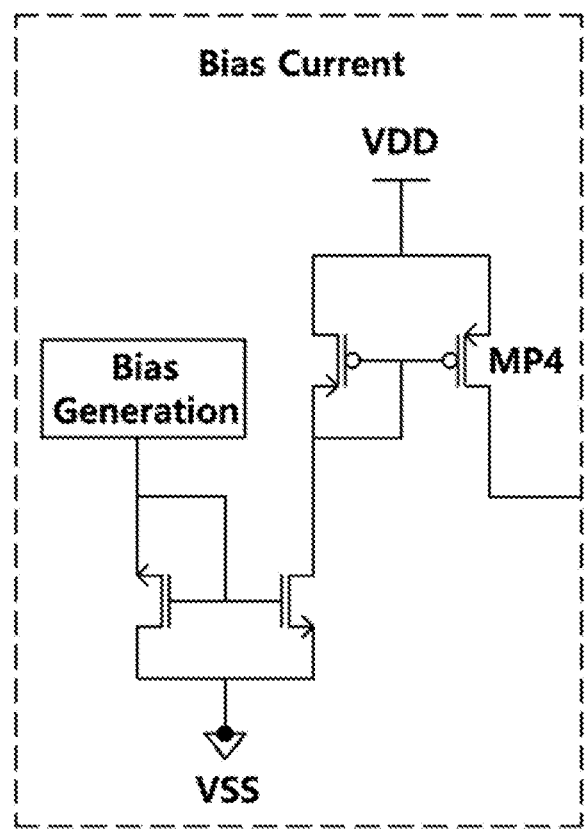
FIG. 2 schematically depicts an example of a bias current generation unit, constructed according to the principles of the disclosure.

FIG. 2 schematically depicts an example of the bias current generation unit 100, constructed according to the principles of the disclosure. The bias current generation unit 100 may include one or more transistors connected to the operation voltage VDD and one or more transistors connected to the ground voltage VSS.

Figure 3:
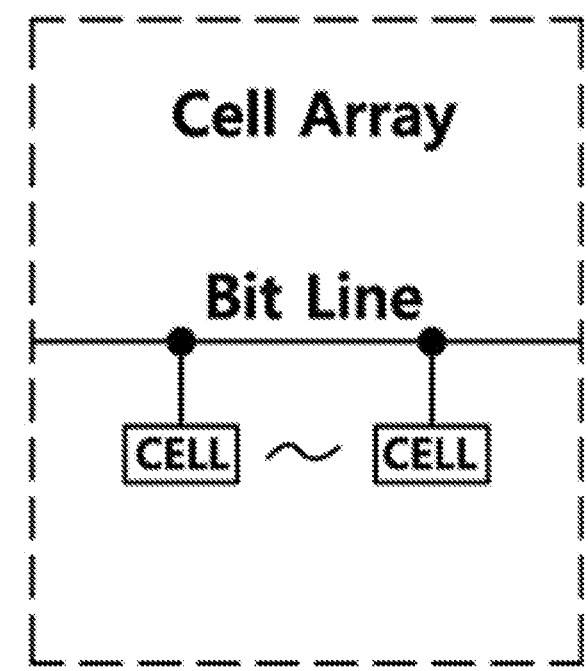
FIG. 3 schematically depicts an example of a cell array, constructed according to the principles of the disclosure.

FIG. 3 schematically depicts an example of the cell array 200, constructed according to the principles of the disclosure. The cell array 200 may be connected to the bit line, and may receive signals for carrying out read and write operations of the cells. The cell array 200 may be constructed with a plurality of cells arrayed in accordance with a number of bits required for an OTP memory device.

FIG. 4 schematically depicts an example of the sense amplifier 300, constructed according to the principles of the disclosure. In an embodiment, a sensing-related device may be constructed with medium voltage (MV) transistors, which may operate with a medium voltage higher than the supply voltage VDD. The devices related to post-sensing operations may be constructed with low voltage (LV) transistors, which may be operated with a low voltage. The MV and LV may not be limited to particular values as they may vary depending on applications and industries. Likewise, the voltage of about 2.0 V mentioned above is an example of a voltage higher than the supply voltage VDD, and a sensing operation may be carried out using a higher voltage.

As illustrated in FIG. 4, the precharge device (e.g., MP2) and the transistor output unit (e.g., MP3, MN3) may be supplied with a first operation voltage V2V from a voltage generator. The first operation voltage V2V may be provided to the source terminals of the transistors MP2, MP3, MN3. The voltage generator may be supplied with the first supply voltage VDD and may generate and supply the first operation voltage V2V to the sense amplifier 300. The first operation voltage V2V may be higher than the first supply voltage VDD. For example, the first operation voltage V2V may be about 2.0 V, and the first supply voltage VDD may be lower than about 1.5 V.

The transistor output unit may include a pull-up device and a pull-down device. The pull-up and pull-down devices may be connected in series between the first operation voltage V2V and a ground voltage VSS. As described above, the pull-up device may include the P-type transistor MP3 and the pull-down device may include the N-type transistor MN3.

The transistor output unit may output the first operation voltage V2V or the ground voltage VSS to the second level shifter 400 depending on the signal of the bit line. The second level shifter 400 may output the first supply voltage VDD or the ground voltage VSS depending on the output voltage of the transistor output unit.

Since the sensing operation may be carried out using the first operation voltage V2V of about 2.0 V, the first supply voltage VDD may be increased to about 2.0 V by the voltage generator, or a voltage higher than about 2.0 V may be dropped, such that a voltage of about 2.0 V may be supplied to the transistors of the sense amplifier 300.

Control signals that may be used as the operation signals of the sense amplifier 300 may be generated by, for example, generating signals based on the supply voltage VDD in the control unit (shown FIG. 1), and then converting the signals to about 2.0 V by the first level shifter 70.

Still referring to FIG. 4, when an unprogrammed cell is to be sensed, the bit line may be precharged to about 2.0 V by the first control signal PCG_ENB, and the P-type transistor MP3 may be turned off and the N-type transistor MN3 may be turned on. Thus, the transistor output unit may outputs the ground voltage VSS to the second level shifter 400, and an output Dout (shown in FIG. 5) of the latch 500 may become low.

When a programmed cell is to be sensed, the bit line voltage precharged by the first control signal PCG_ENB may be slowly discharged to the ground voltage VSS. When the discharging continues and the bit line voltage becomes a certain value calculated by subtracting a threshold voltage Vth of the transistor MP3 (e.g., about 0.5 V) from the precharge voltage of about 2.0 V, the transistor MP3 may be turned on and the output Dout of the latch 500 may become high. As such, even though the supply voltage VDD is lowered to about 0.5 V, the sense amplifier 300 may reliably carry out the sensing operation even when the operation voltage V2V of about 2.0 V is used for the operations. Therefore, it may be possible to carry out an accurate read operation even when the supply voltage level VDD is lowered.

The level shifter 400 may convert the operation voltage V2V of about 2.0 V to the supply voltage VDD for the devices used in the subsequent stages. As shown in FIG. 4, the level shifter 400 may be constructed with the two transistors MP4, MN4, which may result in reducing the layout size. The transistors MP4, MN4 may be MV transistors, which may not be damaged even a voltage higher than about 2.0 V is applied to the gate terminal thereof. The supply voltage VDD may be provided to the source terminal of the transistor MP4 such that the input voltage of about 2.0 V may be level-shifted to a voltage lower than about 2.0 V.

While the sensing operation is carried out by the transistor output unit (e.g., transistors MP3, MN3) with the operation voltage V2V of about 2.0 V, the transistors in the subsequent block may be operated at a substantially lower voltage, and hence it may be no longer necessary to operate the transistors in the subsequent blocks with the operation voltage V2V. In other words, the transistors in the subsequent block may use the supply voltage VDD that is substantially lower than the operation voltage V2V of about 2.0 V.

As described above, in order to operate the devices used for the post-sensing operation with a lower voltage (e.g., supply voltage VDD), the second level shifter 400 may be convert the operation voltage V2V of about 2.0 V to a lower voltage, for example, the supply voltage VDD. As shown in FIG. 4, the second level shifter 400 may be constructed with the transistors MP4, MN4 to reduce the layout size. The transistors MP4, MN4 may be MV transistors to avoid being damaged even when a voltage of about 2.0V is applied thereto. The supply voltage VDD voltage may applied to the source terminal of the MP4 transistor so that the high voltage of about 2.0 V may be level-shifted to a lower voltage, e.g., supply voltage VDD, which may be substantially lower than the high voltage. The level-shifted sensing result from the second level shifter 400 may be latched by the latch circuit 500 when a read enable signal READ EN (shown in FIG. 5) is high, and then be output as the latch output signal Dout signal.

The second level shifter 400 may be connected to an output terminal of the sense amplifier 300. The drain terminal of the transistor MP4 may be connected to the drain terminal of the MN4 transistor, and the gate terminals of MP4 and MN4 may be connected to the output terminal of the sense amplifier 300. Also, the supply voltage VDD may be supplied to the source terminal of the transistor MP4, and the ground voltage may be provided to the source terminal of the transistor MN4. The transistors MP4 and MN4 may be MV transistors. When the transistor MP4 transistor is turned on, the second level shifter 400 may output the supply voltage VDD. When the transistor MN4 is turned on, the output from the second level shifter 400 may be the ground voltage.

Figure 5:
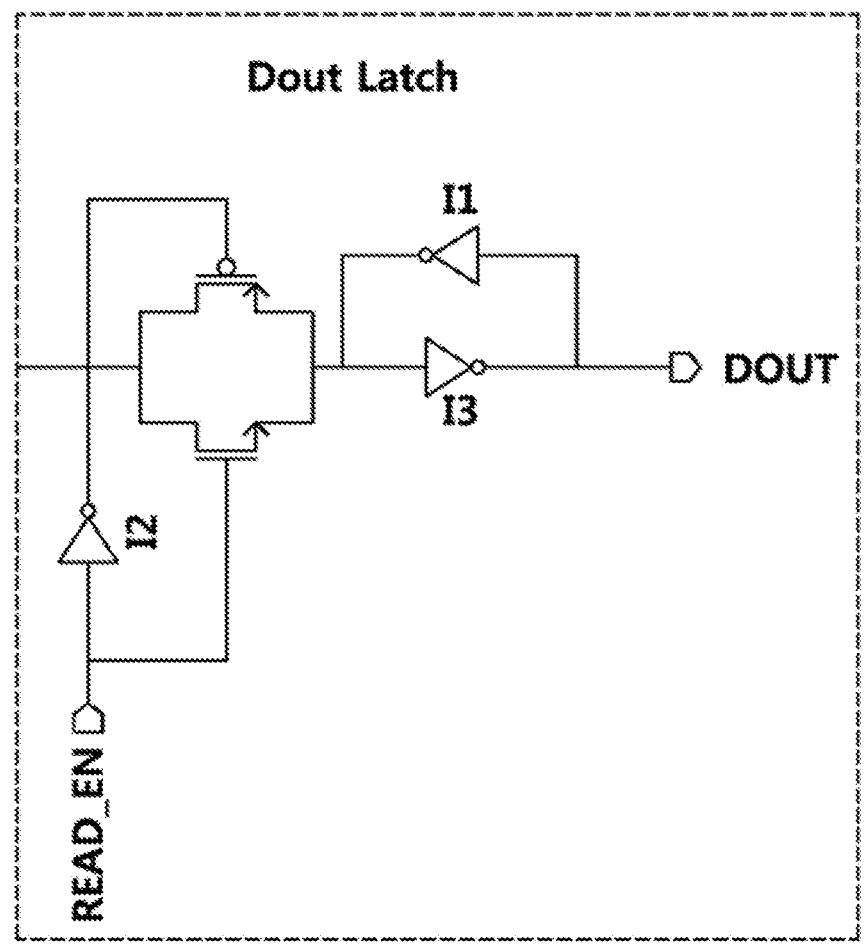
FIG. 5 schematically depicts an example of a latch circuit, constructed according to the principles of the disclosure.

FIG. 5 schematically depicts an example of the latch circuit 500, constructed according to the principles of the disclosure. The latch circuit 500 may be constructed with one or more LV transistor that may operate with the supply voltage VDD.

As described above, according to the principles of the disclosure, even when the resistance of the programmed cells is high, the sensing operation of the programmed cells may be carried out when the bit line voltage is lowered to the value of the operation voltage V2V (about 2.0 V) subtracted by the threshold voltage Vth of the PMOS transistor MP3 of the sense amplifier 300, which may allow to secure a greater sensing margin.

The terms "including," "comprising" and variations thereof, as used in this disclosure, mean "including, but not limited to," unless expressly specified otherwise.

The terms "a," "an," and "the," as used in this disclosure, means "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

Although process steps, method steps, or the like, may be described in a sequential order, such processes and methods may be configured to work in alternate orders. In other words, any sequence or order of steps that may be described does not necessarily indicate a requirement that the steps be performed in that order. The steps of the processes or methods described herein may be performed in any order practical. Further, some steps may be performed simultaneously.

When a single device or article is described herein, it will be readily apparent that more than one device or article may be used in place of a single device or article. Similarly, where more than one device or article is described herein, it will be readily apparent that a single device or article may be used in place of the more than one device or article. The functionality or the features of a device may be alternatively embodied by one or more other devices which are not explicitly described as having such functionality or features.

While the disclosure has been described in terms of exemplary embodiments, those skilled in the art will recognize that the disclosure can be practiced with modifications in the spirit and scope of the appended claim, drawings and attachment. The examples provided herein are merely illustrative and are not meant to be an exhaustive list of all possible designs, embodiments, applications or modifications of the disclosure.

What is claimed is:

1. A semiconductor memory device, comprising,
a memory cell;
a bit line connected to the memory cell; and
a sense amplifier that is connected to the bit line, receives a first control signal, and detects and amplifies a bit line signal of the bit line, the sense amplifier comprising:
 a precharge device that is turned on or turned off based on a read control signal; and
 a transistor output unit that outputs an output voltage based on the bit line signal when the precharge device is turned off.

2. The semiconductor memory device of claim 1, further comprising a voltage generator that generates a first operation voltage, wherein the precharge device and the transistor output unit are supplied with the first operation voltage.

3. The semiconductor memory device of claim 2, wherein the transistor output unit comprises a pull-up device and a pull-down device connected in series and coupled between the first operation voltage and a ground voltage.

4. The semiconductor memory device of claim 2, wherein the transistor output unit outputs the first operation voltage or the ground voltage to a second level shifter based on the bit line signal.

5. The semiconductor memory device of claim 4, wherein the second level shifter outputs the first supply voltage or the ground voltage based on an output voltage of the transistor output unit.

6. The semiconductor memory device of claim 1, further comprising a first level shifter that coverts the read control signal to a read control voltage,
wherein the read control voltage is supplied to the precharge device.

7. The semiconductor memory device of claim 6, wherein the first control signal and the read control voltage are supplied to the precharge device.

8. The semiconductor memory device of claim 1, further comprising a voltage generator that receives a first supply voltage, generates a first operation voltage based on the first supply voltage and supplies the first operation voltage to the sense amplifier.

9. The semiconductor memory device of claim 1, wherein the memory cell is a programmed cell, and the bit line voltage of the bit line connected to the programmed cell is discharged to a ground level when the sense amplifier receives the first control signal.

10. The semiconductor memory device of claim 1, wherein the memory cell is an unprogrammed cell, and the bit line voltage of the bit line connected to the unprogrammed cell is charged to a first operation voltage when the sense amplifier receives the first control signal.

11. The semiconductor memory device of claim 5, wherein the sense amplifier and the level shifter comprise a transistor that operates at the first operation voltage without being damaged.

12. The semiconductor memory device of claim 8, wherein the first operation voltage is higher than the first supply voltage.

13. The semiconductor memory device of claim 12, wherein the first operation voltage is about 2 V, and the first supply voltage is less than about 1.5 V.

* * * * *